United States Patent
Hembacher et al.

(10) Patent No.: US 10,599,051 B2
(45) Date of Patent: Mar. 24, 2020

(54) PROJECTION EXPOSURE APPARATUS, AND METHOD FOR REDUCING DEFORMATIONS, RESULTING FROM DYNAMIC ACCELERATIONS, OF COMPONENTS OF THE PROJECTION EXPOSURE APPARATUS

(71) Applicant: Carl Zeiss SMT GmbH, Oberkochen (DE)

(72) Inventors: Stefan Hembacher, Bobingen (DE); Erik Loopstra, Huernheim (DE); Jens Kugler, Aalen (DE); Bernhard Geuppert, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/368,054

(22) Filed: Mar. 28, 2019

(65) Prior Publication Data
US 2019/0219926 A1    Jul. 18, 2019

Related U.S. Application Data

(63) Continuation of application No. PCT/EP2017/073109, filed on Sep. 14, 2017.

(30) Foreign Application Priority Data

Oct. 6, 2016    (DE) ......................... 10 2016 219 330

(51) Int. Cl.
*G03F 7/20* (2006.01)
*G02B 7/182* (2006.01)

(52) U.S. Cl.
CPC ......... *G03F 7/70825* (2013.01); *G02B 7/182* (2013.01); *G03F 7/7085* (2013.01); *G03F 7/70833* (2013.01)

(58) Field of Classification Search
None
See application file for complete search history.

(56) References Cited

U.S. PATENT DOCUMENTS 10,048,592 B2    8/2018    Andre et al.
2011/0194088 A1    8/2011    Butler et al.

FOREIGN PATENT DOCUMENTS

DE    10 2010 030 913 A1    10/2011
DE    10 2012 214 232 A1    8/2013
(Continued)

OTHER PUBLICATIONS

German Office Action, with translation thereof, for corresponding DE Appl No. 10 2016 209 359.2, dated Jan. 27, 2017.
(Continued)

*Primary Examiner* — Michelle M Iacoletti
(74) *Attorney, Agent, or Firm* — Fish & Richardson P.C.

(57) ABSTRACT

A projection exposure apparatus for semiconductor lithography includes at least one component, and a support device with at least one support actuator which acts on at least one support location of the component so that deformations of the component are reduced. The support device includes a control unit for triggering the at least one support actuator. The control unit is configured to trigger the support actuator in the event of a dynamic acceleration acting on the component. The disclosure also relates to a method for reducing deformations, resulting from dynamic accelerations, of a projection exposure apparatus for semiconductor lithography.

19 Claims, 3 Drawing Sheets

(56) References Cited

FOREIGN PATENT DOCUMENTS

| | | |
|---|---|---|
| DE | 10 2014 218 474 A1 | 3/2016 |
| EP | 2 128 700 A1 | 12/2009 |
| JP | 2006-093262 A | 4/2006 |

OTHER PUBLICATIONS

Translation of International Search Report for corresponding PCT Appl No. PCT/EP2017/073109, dated Dec. 18, 2017.

PROJECTION EXPOSURE APPARATUS, AND METHOD FOR REDUCING DEFORMATIONS, RESULTING FROM DYNAMIC ACCELERATIONS, OF COMPONENTS OF THE PROJECTION EXPOSURE APPARATUS

CROSS-REFERENCE TO RELATED APPLICATIONS

The present application is a continuation of, and claims benefit under 35 USC 120 to, international application PCT/EP2017/073109, filed Sep. 14, 2017, which claims benefit under 35 USC 119 of German Application No. 10 2016 219 330.9, filed Oct. 6, 2016. The entire disclosure of these applications are incorporated by reference herein.

FIELD

The disclosure relates to a projection exposure apparatus for semiconductor lithography. The disclosure further relates to a method for reducing deformations, resulting from dynamic accelerations, of components of a projection exposure apparatus according.

BACKGROUND

In projection exposure apparatuses for semiconductor lithography, and in particular in the objectives used in the apparatuses, rapidly moved optical elements, for example mirrors, have long been used to correct image errors during the exposure. However, the movement or the acceleration of the optical elements generally means that, on account of the prevailing inertial forces, certain deformations of the optical elements involved occur during their movement or during their acceleration. In the past, however, in conventional projection exposure apparatuses, the deformations in question were often too small to lead to a problematic deterioration of the imaging properties of the system. More recently, however, systems have increasingly been used in which a relatively rapid movement of the mirrors is needed, particularly in view of the fact that every displacement of the mask used for the exposure leads to an astigmatic error, which can only be corrected via a movement of the mirror. In operation, however, the masks, or so-called reticles, are moved regularly.

In addition, higher exposure rates and low acceptable error budgets lead to a greater importance of the deformations of the wafer that is to be exposed. The wafer usually heats up during the operation of the apparatus, which results in a deformation that cannot be corrected on the wafer itself or that can only be corrected with very great effort on the wafer itself. For this reason too, future systems will need to meet increasing demands in respect of rapid positionability of the mirrors used. Moreover, as the numerical aperture of the objectives used increases, the mirror diameters also increase. Since the mirrors are usually mounted with kinematic determination at three points, there is therefore also an increased likelihood of the mirror sagging on account of an acceleration acting on it. In particular, this sagging is often proportional to the fourth power of the mirror diameter. With the same material and the same the thickness, a doubling of the mirror diameter consequently can lead to a sixteen times greater deformation which, depending on optical sensitivity, is manifested in a thirty-two times greater wavefront error.

A related set of issues also exists for further components of projection exposure apparatuses, which further components also experience deformations as a result of dynamic accelerations, with the deformations potentially leading overall to a deterioration in the performance of the apparatus.

The possibilities of overcoming these problems by changing the materials used can be extremely limited. The concepts noted above relate only to the compensating of gravitational effects and are not suitable for effectively reducing sagging under dynamic loads. A corresponding concept is disclosed in the German laid-open specification DE 10 2012 214 232 A1, which was filed by the applicant and which is fully incorporated herein by reference.

SUMMARY

The disclosure seeks to provide a projection exposure apparatus and a method for operating a projection exposure apparatus, which apparatus and method effectively reduce the deformation of a component during operation.

In one general aspect, the disclosure provides a projection exposure apparatus for semiconductor lithography, which includes at least one component and a support device with at least one support actuator which acts on at least one support location of the component so that deformations of the component are reduced. The support device includes a control unit for triggering the at least one support actuator. The control unit is configured to trigger the support actuator in the event of a dynamic acceleration acting on the component.

A projection exposure apparatus for semiconductor lithography according to the disclosure includes at least one component on which, at at least one support location, a support actuator of a support device acts for the purpose of reducing deformations. The support device includes a control unit for triggering the at least one support actuator. The control unit is configured to trigger the support actuator in the event of a dynamic acceleration acting on the component. In other words, the support actuator serves in particular to reduce deformations of the component that result from inertial forces acting on the latter.

As has already been mentioned above, the inertial forces can arise, on the one hand, from the fact that the inert mass elements of a mirror or of another optical or non-optical component of the apparatus may have to be moved rapidly for positioning. On the other hand, the movement discussed does not necessarily have to be the consequence of a deliberate actuation of the component. It is likewise conceivable, by the measure according to the disclosure, to reduce deformations of components that are attributable to external influences, for example seismic or other vibrations of the ground support or of the surroundings. A dynamic acceleration within the meaning of the present disclosure is to be understood as an acceleration which, for example in contrast to gravitational acceleration, occurs as a temporary event. As a result, it is possible in any case that the acceleration-induced deformation of the mirror during the rapid positioning of the latter is reduced. The component can in particular also be a part of the frame structure of the apparatus, in particular a part of what is called a sensor frame. A sensor frame within the meaning of the present application is a structure that does not take part substantially in the static or dynamic loads that act on the components of the projection exposure apparatus. Therefore, the sensor frame basically only supports itself and the components involved in the sensor system. Typically, it is largely decoupled in mechanical terms from the rest of the structure of the apparatus and thus constitutes an extremely reliable position reference for determining the positions of the components involved. This position reference can be further improved by the fact that deformations of the sensor frame are reduced via the measures according to the disclosure.

In a variant of the disclosure, at least one position actuator is present for positioning the component, and the support actuator acts on the support location of the component only when the position actuator is triggered.

To determine the deformation of the component, it is particularly advantageous to use one or more sensors, which can be configured as optical encoders for example. The sensors can be arranged in particular on a sensor frame of the installation. An advantage of the solution involving the use of a sensor is in particular that the real conditions at the component can be detected quickly and reliably, and, on the basis of the values detected by the sensor, the support actuators can be triggered via a control unit in an optimized manner in near real time.

Additionally or alternatively, the control unit may be suitable for triggering the support actuator on the basis of at least one known trajectory of at least one point of the component. In other words, via a mechanical model, an anticipated deformation behavior of the component is calculated from a known and intended movement of the component, which movement is in particular associated with the triggering of the position actuators. For example, this can take place in the control unit which, on the basis of the calculated values, can then perform optimized triggering of the support actuators. An advantage of this method is in particular its speed; the control parameters can in practice be made available on a preventive basis, such that, even in the event of extremely rapid positioning of the component, it is possible to achieve sufficient assistance and therefore effective reduction of the deformation associated with the change of position.

In a further variant of the disclosure, an acceleration sensor or a plurality of acceleration sensors can be present, with which the acceleration values over time are recorded at one or more points of the component. The control unit may be suitable for triggering the support actuator on the basis of the measured acceleration values. In this case too, knowledge of the mechanical properties of the component used is desirable. Therefore, this case also involves determination of the anticipated deformation of the component from the mechanical model of the component and from the recorded acceleration values.

Like the position actuators, the support actuators can in particular be Lorentz actuators or other mechanical actuators that can be rapidly triggered.

At least one of the support actuators or all of them can be arranged on a force frame of the projection exposure apparatus. A force frame is understood as the mechanical bearing structure of the projection exposure apparatus or of the projection objective. It takes up the static loads resulting from the gravitational force acting on the components, and it also takes up dynamic loads, for example from positioning movements of the components. Alternatively, the support actuator or support actuators can also be arranged on the aforementioned sensor frame of the projection exposure apparatus or also on a mechanical auxiliary structure or an auxiliary frame of the projection exposure apparatus.

BRIEF DESCRIPTION OF THE DRAWINGS

Illustrative embodiments and variants of the disclosure are explained in more detail below with reference to the drawing, in which.

DESCRIPTION OF EXEMPLARY EMBODIMENTS

Figure 1:
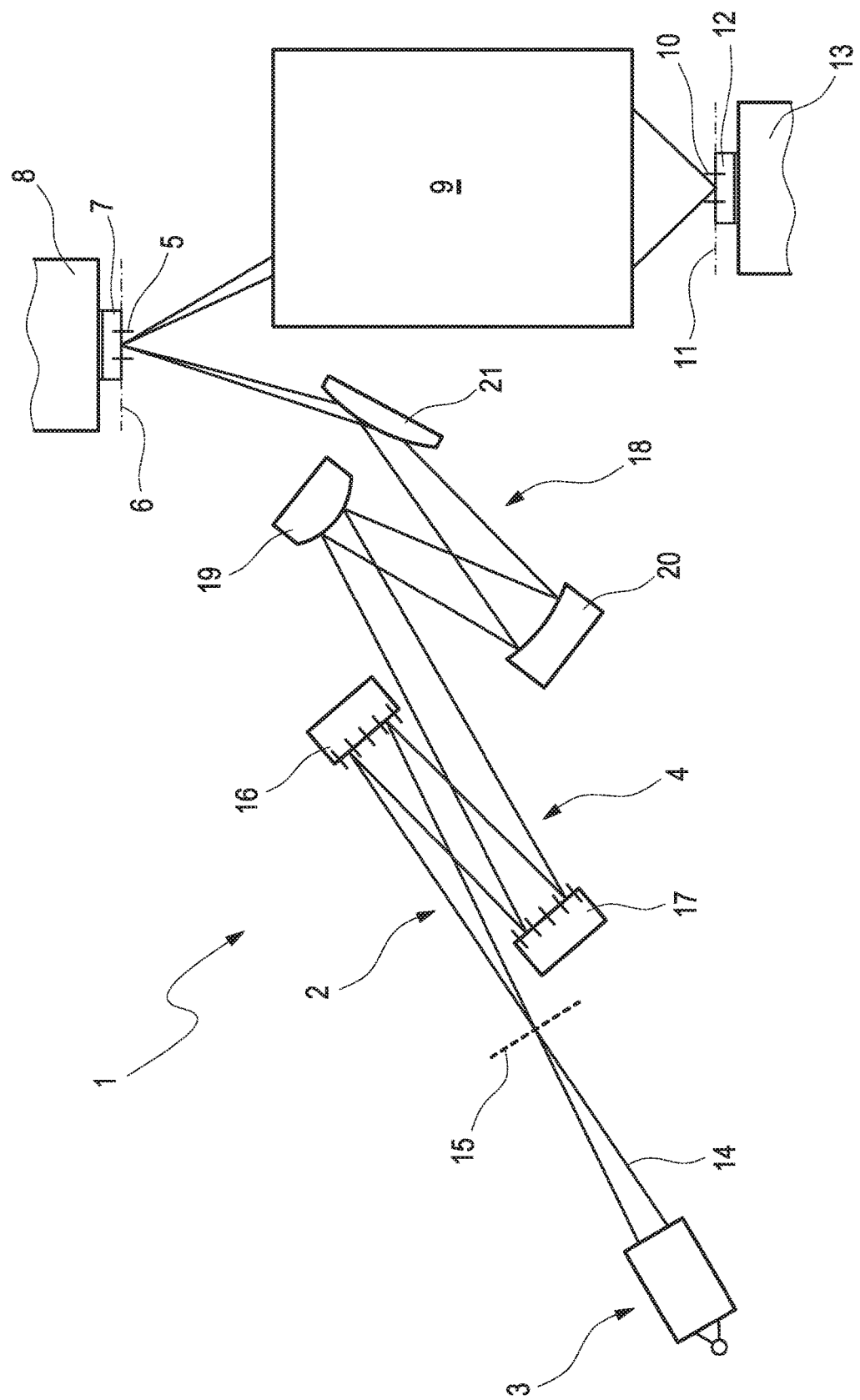
FIG. 1 shows the basic construction of a projection exposure apparatus for microlithography.

FIG. 1 shows by way of example the basic construction of a microlithographic EUV projection exposure apparatus 1 in which the disclosure can find application. An illumination system 2 of the projection exposure apparatus 1 includes, besides a light source 3, also an illumination optical unit 4 for the illumination of an object field 5 in an object plane 6. EUV radiation 14 generated via the light source 3 is aligned via a collector, which is integrated in the light source 3, in such a way that the radiation passes through an intermediate focus in the region of an intermediate focal plane 15 before it is incident on a mirror 16. Downstream of the mirror 16, the EUV radiation 14 is reflected by a further mirror 17. With the aid of the mirror 17 and an optical assembly 18 having mirrors 19, 20 and 21, regions of the mirror 16 are imaged into the object field 5.

A reticle 7 arranged in the object plane 6 is illuminated, the reticle 7 being held by a reticle holder 8, illustrated schematically. A projection optical unit 19 (shown only schematically), which among other things includes further mirrors (not shown in FIG. 1), serves for imaging the object field 5 into an image field 10 in an image plane 9. A structure on the reticle 7 is imaged on a light-sensitive layer of a wafer 12 held by a wafer holder 13 that is likewise illustrated in part, the wafer being arranged in the region of the image field 10 in the image plane 11. The light source 3 can emit used radiation in particular in the range between 5 nm and 30 nm.

Figure 2:
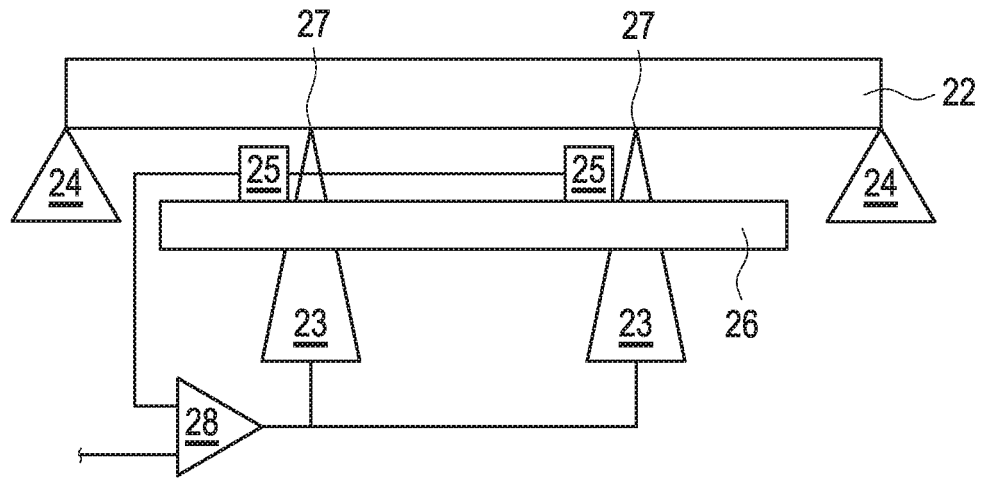
FIG. 2 shows a first embodiment of the disclosure in a base state.

FIG. 2 shows, in a first embodiment of the disclosure, a mirror 22 as a example of a component of the projection exposure apparatus shown in FIG. 1, which mirror 22 is provided with support actuators 23 according to the disclosure. In the example shown, two of the usually three or more position actuators 24 are indicated by way of example, and the mirror 22, which can be configured as a multilayer mirror for example, rests on these position actuators 24. The position actuators 24 may serve to fix the mirror 22, but they may also serve for its dynamic movement, if appropriate for correcting image errors. The position actuators 24 can in particular be so-called Lorentz actuators or similar. In the example shown, two sensors 25 are present which, in relation to a sensor frame 26, are able to measure deformations of the mirror 22, particularly in the region of the support locations 27 of the support actuators 24 during an actuation of the mirror 22. The sensors 25 can be optical encoders, for example, which are able to resolve position changes as far as the subnanometer range. The sensors are connected to a control unit 28, via which the support actuators 23 can be triggered when desired. In the example shown, the support locations 27 on which the support actuators 23 can act are free of forces, since the system, in particular the mirror 22, is in the stationary state, and therefore no acceleration other than gravitation acts on the components involved.

Figure 3:
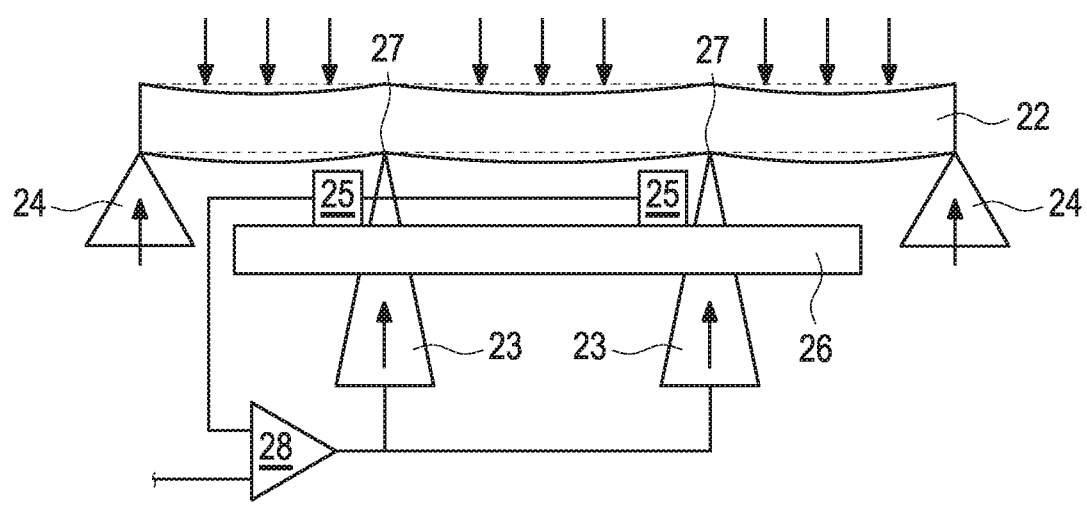
FIG. 3 shows the first embodiment of the disclosure in an activated state.

FIG. 3 now shows the case in which the mirror 22 is moved via the position actuators 24, for example for correcting a selected image error, in the direction of the unlabeled bold arrows. The inertial forces resulting from the accelerated movement of the individual volume elements of the mirror 22 are likewise indicated by unlabeled arrows. Without further measures being taken, these inertial forces would lead to considerable sagging of the mirror 22 between the two position actuators 24 shown in FIG. 3. Since the control unit 28 triggers the support actuators 23, on the basis of the sensor signal of the sensors 25, in such a way that the desired value is set at the support locations 27, the extent of the sagging associated with the accelerated movement of the mirror 22 is considerably reduced, as can be seen clearly from FIG. 3. It will also be clear that there is of course some residual sagging of the mirror 22 between the support actuators 23 and position actuators 24, but this sagging is not nearly so pronounced as it is in the unsupported case. Only two actuators 23 are shown in the example in FIGS. 2 and 3, in order to make the illustrations clearer. It will be appreciated, however, that a person skilled in the art will select the distribution and number of the support actuators 23 on the basis of his knowledge of the masses, stiffness values and acceleration values involved, in such a way that a satisfactory reduction of the sagging associated with the positioning of the mirror 22 will be able to be achieved with acceptable outlay in terms of equipment.

Figure 4:
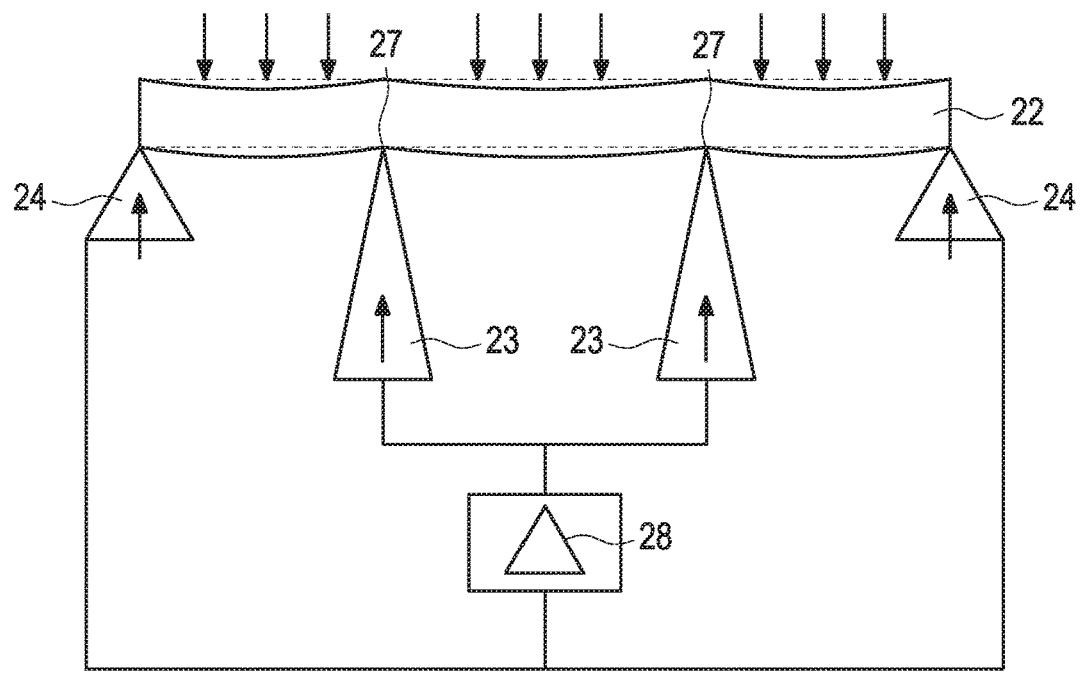
FIG. 4 shows a first variant of the disclosure.

FIG. 4 differs from FIG. 3 in that the variant that it shows does not have any sensors. Instead, the signal made available to the control unit 28 is the same one that goes to the position actuators 24. From this signal, the control unit 28 can determine the trajectory of the individual mirror points or of a representative selection of the mirror points and, using a suitable mechanical model, can determine an expected mirror deformation. On the basis of this analysis, the support actuators 23 can then be triggered to minimize the overall deformation of the mirror 22 in the manner known from FIG. 3.

Figure 5:
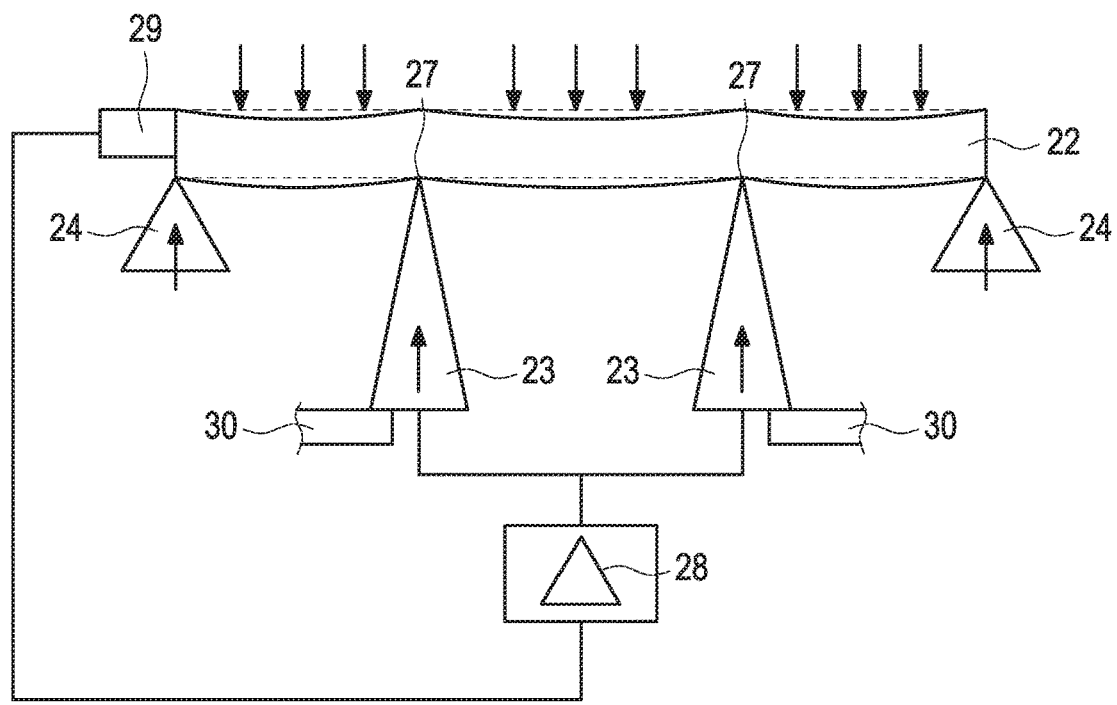
FIG. 5 shows a further variant of the disclosure.

In contrast to this, FIG. 5 shows an embodiment of the disclosure in which the acceleration (shown by way of example at one position in the figure) is determined via an acceleration sensor 29. Then, in a manner similar to that known from FIG. 4, the parameters supplied by the acceleration sensors 29 are converted into control signals for the support actuators 23 on the basis of a suitable mechanical model of the mirror 22, resulting in the same effect as is known from FIGS. 4 and 3. It is advantageous here, in relation to the variant shown in FIG. 4, that external effects not attributable to triggering of the position actuators 24 can also be effectively taken into consideration. The same of course applies to the variant shown in FIG. 2 and in FIG. 3.

FIG. 5 shows a schematic view of an example of a holding structure 30 on which the support actuators 23 are arranged. The holding structure can be a force frame, a sensor frame or also an auxiliary frame.

Instead of being applied to the mirror 22 shown in FIGS. 2 to 5, the disclosure can, as has already been mentioned, also be applied to further components of the projection exposure apparatus, in particular to parts of the bearing structure or also of the sensor frame.

Moreover, the measures shown in the figures can also be combined, for example in order to better adjust a model (based on a trajectory or the measurement of the acceleration) via a direct measurement and to reduce uncertainty in the model prediction.

What is claimed is:

1. An apparatus, comprising:
    a component; and
    a support device, comprising:
        a support actuator configured to act on a support location of the component to reduce deformations of the component;
        a control unit configured to trigger the support actuator when a dynamic acceleration acts on the component; and
        a position actuator configured to position the component,
    wherein:
        the support device is configured so that the support actuator acts on the support location of the component only when the position actuator is triggered; and
        the apparatus is a semiconductor lithography projection exposure apparatus.

2. The apparatus of claim 1, further comprising a sensor configured to determine the deformation of the component when a dynamic acceleration occurs, wherein the sensor is connected to the control unit, and the control unit is configured to act on the support actuator based on parameters measured by the sensor.

3. The apparatus of claim 1, wherein the control unit is configured to trigger the support actuator based on a known trajectory of a point of the component.

4. The apparatus of claim 1, further comprising an acceleration sensor configured to measure acceleration at a point of the component, wherein the control unit is configured to trigger the support actuator based on the measured acceleration values.

5. The apparatus of claim 1, further comprising a holding structure, wherein the support actuator is arranged on the holding structure.

6. The apparatus of claim 5, wherein the holding structure comprises a member selected from the group consisting of a force frame, a sensor frame, and an auxiliary frame.

7. The apparatus of claim 1, wherein the component comprises a mirror.

8. The apparatus of claim 1, further comprising a sensor frame, wherein the component is part of the sensor frame.

9. An apparatus, comprising:
    components; and
    a support device, comprising:
        support actuators configured to act on support locations of the components to reduce deformations of the components;
        a control unit configured to trigger the support actuators when a dynamic acceleration acts on the components; and
        position actuators configured to position the components,
    wherein:
        the support device is configured so that the support actuators act on the support locations of the components only when the position actuators are triggered; and
        the apparatus is a semiconductor lithography projection exposure apparatus.

10. The apparatus of claim 9, further comprising a sensor configured to determine the deformation of the component when a dynamic acceleration occurs, wherein the sensor is connected to the control unit, and the control unit is configured to act on the support actuator based on parameters measured by the sensor.

11. The apparatus of claim 9, wherein the control unit is configured to trigger the support actuators based on known trajectories of point of the components.

12. The apparatus of claim 9, further comprising acceleration sensors configured to measure acceleration at point of the components, wherein the control unit is configured to trigger the support actuators based on the measured acceleration values.

13. The apparatus of claim 9, further comprising a holding structure, wherein the support actuators are arranged on the holding structure.

14. A method for reducing deformations that result from a dynamic acceleration of a component of a semiconductor lithography projection exposure apparatus, the method comprising:
   using a support actuator to act on a support location of the component only when: i) the component dynamically accelerates; and ii) a position actuator configured to position the component is triggered.

15. The method of claim 14, further comprising:
   using a sensor to measure at least one parameter; and
   triggering the support actuator based on at least one measured parameter.

16. The method of claim 14, further comprising triggering the support actuator based on a known trajectory of a point of the component.

17. The method of claim 14, further comprising triggering the support actuator based on measured acceleration values.

18. The method of claim 14, wherein:
   the semiconductor lithography projection exposure apparatus comprises a plurality of components; and
   for each component, the method comprises using a corresponding support actuator to act on a support location of the component only when; i) the component dynamically accelerates; and ii) a corresponding position actuator is triggered.

19. The method of claim 18, wherein the component comprises a mirror.

* * * * *